United States Patent
Lee et al.

(10) Patent No.: US 8,742,854 B1
(45) Date of Patent: Jun. 3, 2014

(54) PERIODIC SIGNAL GENERATORS HAVING MICROELECTROMECHANICAL RESONATORS THEREIN THAT SUPPORT GENERATION OF HIGH FREQUENCY LOW-TCF DIFFERENCE SIGNALS

(75) Inventors: Seungbae Lee, Los Gatos, CA (US); Harmeet Bhugra, San Jose, CA (US); Ashwin Samarao, San Jose, CA (US)

(73) Assignee: Integrated Device Technology Inc., San Jose, CA (US)

( * ) Notice: Subject to any disclaimer, the term of this patent is extended or adjusted under 35 U.S.C. 154(b) by 442 days.

(21) Appl. No.: 13/186,332

(22) Filed: Jul. 19, 2011

Related U.S. Application Data (63) Continuation-in-part of application No. 12/570,610, filed on Sep. 30, 2009, now Pat. No. 8,063,720.

(60) Provisional application No. 61/238,449, filed on Aug. 31, 2009.

(51) Int. Cl.
*H03B 21/01* (2006.01)
*H03B 5/30* (2006.01)

(52) U.S. Cl.
USPC ............ 331/43; 331/53; 331/155; 331/156; 331/116 R; 331/107 A; 333/186; 310/309; 310/315

(58) Field of Classification Search
USPC ...... 331/2, 37, 41–43, 53, 116 R, 107 A, 155, 331/156, 162, 176, 187; 333/186, 200; 310/309, 315, 367–370
See application file for complete search history.

(56) References Cited

U.S. PATENT DOCUMENTS

| | | | | |
|---|---|---|---|---|
| 4,872,765 | A * | 10/1989 | Schodowski | 374/117 |
| 6,133,795 | A * | 10/2000 | Williams | 331/9 |
| 6,630,871 | B2 * | 10/2003 | Ma et al. | 331/116 M |
| 6,831,525 | B1 * | 12/2004 | Beaudin et al. | 331/176 |
| 7,211,926 | B2 * | 5/2007 | Quevy et a | 310/315 |
| 7,212,075 | B2 * | 5/2007 | Young et a | 331/176 |
| 7,248,128 | B2 * | 7/2007 | Mattila et al. | 331/175 |
| 7,443,258 | B2 * | 10/2008 | Hagelin | 331/156 |
| 7,514,853 | B1 | 4/2009 | Howe et al. | |
| 7,639,105 | B2 | 12/2009 | Ayazi et al. | |
| 7,800,282 | B2 | 9/2010 | Ayazi et al. | |
| 7,843,284 | B2 | 11/2010 | Ayazi et al. | |
| 7,888,843 | B2 | 2/2011 | Ayazi et al. | |

(Continued)

OTHER PUBLICATIONS

A.K. Samarao et al.; "Combined Capacitive and Piezoelectric Transduction for High Performance Silicon Microresonators"; IEEE 2011 24th International Conference on Micro Electro Mechanical Systems (MEMS) 2011, Cancun, Mexico, Jan. 23-27, 2011, pp. 169-172.*

(Continued)

*Primary Examiner* — Barbara Summons
(74) *Attorney, Agent, or Firm* — Myers, Bigel, et al.

(57) ABSTRACT

A periodic signal generator is configured to generate high frequency signals characterized by relatively low temperature coefficients of frequency (TCF). A microelectromechanical resonator, such as concave bulk acoustic resonator (CBAR) supporting capacitive and piezoelectric transduction, may be geometrically engineered as a signal generator that produces two periodic signals having unequal resonant frequencies with unequal temperature coefficients. Circuitry is also provided for combining the two periodic signals using a mixer to thereby yield a high frequency low-TCF periodic difference signal at an output of the periodic signal generator.

14 Claims, 8 Drawing Sheets

(56) References Cited

U.S. PATENT DOCUMENTS

| | | | |
|---|---|---|---|
| 7,924,119 | B1 | 4/2011 | Ayazi et al. |
| 7,939,990 | B2 | 5/2011 | Wang et al. |
| 7,982,550 | B1 * | 7/2011 | Quevy et al. ............... 331/176 |
| 8,061,013 | B2 | 11/2011 | Ayazi et al. |
| 8,063,720 | B2 * | 11/2011 | Ayazi et al. ............... 333/186 |
| 2005/0242904 | A1 | 11/2005 | Lutz et al. |
| 2006/0261703 | A1 | 11/2006 | Quevy et al. |
| 2008/0079515 | A1 * | 4/2008 | Ayazi et al. ............... 333/187 |
| 2010/0127596 | A1 | 5/2010 | Ayazi et al. |
| 2010/0127798 | A1 | 5/2010 | Ayazi et al. |
| 2011/0074247 | A1 | 3/2011 | Hohlfeld et al. |

OTHER PUBLICATIONS

M.J. Dalal et al.; "Simultaneous Dual-Mode Excitation of Piezo-On-Silicon Micromechanical Oscillator for Self-Temperature Sensing"; IEEE 2011 24th International Conference on Micro Electro Mechanical Systems (MEMS) 2011, Cancun, Mexico, Jan. 23-27, 2011, pp. 489-492.*

S.A. Gorgi Zadeh et al.; "the Phase Noise of an Oscillator Employing a Dual MEMS Resonator Temperature Compensation Scheme"; 2010 International Conference on Microelectronics (ICM), Dec. 19-22, 2010, pp. 160-163.*

E.P. Quevy et al.; "Redundant MEMS Resonators for Precise Reference Oscillators"; 2005 IEEE Radio Frequency Integrated Circuits (RFIC) Symposium, Jun. 12-14, 2005, pp. 113-116.*

Courcimault et al., "High-Q Mechanical Tuning of MEMS Resonators Using a Metal Deposition—Annealing Technique," The 13$^{th}$ International Conference on Solid-State Sensors, Actuators and Microsystems, Seoul, Korea, Jun. 5-9, 2005, pp. 875-878.

Hsu et al., "In Situ Localized Annealing for Contamination Resistance and Enhanced Stability in Nickel Micromechanical Resonators," 10$^{th}$ International Conference on Solid-State Sensors and Actuators, Sendai, Japan, Jun. 7-10, 1999, pp. 932-935.

Hsu et al., "Frequency Trimming for MEMS Resonator Oscillators." Discera Inc., Ann Arbor, Michigan whsu@discera.com (2007).

International Preliminary Report on Patentability Corresponding to International Application No. PCT/US2009/065489; Date of Mailing: Jun. 9, 2011; 10 pages.

Invitation to Pay Additional Fees, International Application No. PCT/US2009/065489, Jun. 2, 2010.

Krause et al., "Determination of aluminum diffusion parameters in silicon," Journal of Applied Physics, vol. 91, No. 9, May 1, 2002, pp. 5645-5649.

Notification of Transmittal of the International Search Report and the Written Opinion of the International Searching Authority, or the Declaration, PCT/US2009/065489, Jul. 12, 2010.

Pourkamali et al., "Low-Impedance VHF and UHF Capacitive Silicon Bulk Acoustic Wave Resonators—Part I: Concept and Fabrication," IEEE Transactions on Electron Devices 54:2017-2023 (2007).

Samarao et al., "Post-Fabrication Electrical Trimming of Silicon Bulk Acoustic Resonators Using Joule Heating," 22$^{nd}$ IEEE International Conference on Micro Electro Mechanical Systems MEMS 2009, Sorrento, Italy. Jan. 25-29, 2009.

Sundaresan et al., "Electronically Temperature Compensated Silicon Bulk Acoustic Resonator Reference Oscillators," IEEE Journal of Solid-State Circuits 42:1425-1434. (2007).

Samarao, Ashwin K., "Compensation and Trimming for Silicon Micromechanical Resonators and Resonator Arrays for Timing and Spectral Processing"—A Dissertation Presented to the Academic Faculty—Georgia Institute of Technology; May 2011; Published on Jul. 6, 2011; 155 pages.

Samarao et al., "Passive TCF compensation in high Q silicon micromechanical resonators"; Micro Electro Mechanical Systems (MEMS), 2010 IEEE 23$^{rd}$ International Conference on Jan. 24-28, 2010; Wanchai, Hong Kong; pp. 116-119.

Vig, John R., "Dual-mode Oscillators for Clocks and Sensors"; Ultrasonics Symposium, 1999. Proceedings. 1999 IEEE; pp. 859-868; vol. 2.

* cited by examiner

PERIODIC SIGNAL GENERATORS HAVING MICROELECTROMECHANICAL RESONATORS THEREIN THAT SUPPORT GENERATION OF HIGH FREQUENCY LOW-TCF DIFFERENCE SIGNALS

REFERENCE TO PRIORITY APPLICATION

This application is a continuation-in-part of U.S. application Ser. No. 12/570,610, filed Sep. 30, 2009, now U.S. Pat. No. 8,063,720, which claims priority to U.S. Provisional Application Ser. No. 61/238,449, filed Aug. 31, 2009, the disclosures of which are hereby incorporated herein by reference.

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMs) resonators can provide small form factor, ease of integration with conventional semiconductor fabrication techniques and high f·Q products. High frequency and high-Q width-extensional mode silicon bulk acoustic resonators (SiBARs) and film bulk acoustic wave resonators (FBARs) have demonstrated atmospheric quality factors (Q) in excess of 10,000 at or above 100 MHz, with moderate motional resistances. Such resonators are disclosed in an article by S. Pourkamali et al., entitled "Low-Impedance VHF and UHF Capacitive Silicon Bulk Acoustic Wave Resonators—Part I: Concept and Fabrication," IEEE Trans. On Electron Devices, Vol. 54, No. 8, pp. 2017-2023, August (2007), the disclosure of which is hereby incorporated herein by reference.

Unfortunately, such resonators may be characterized by relatively high temperature coefficient of frequency (TCF) values that require active compensation using temperature compensation circuits and/or relatively complex fabrication techniques to reduce TCF. Circuit-based compensation techniques typically increase the complexity of a resonator device and increase power consumption. Alternatively, fabrication-based compensation techniques that reduce TCF may cause a reduction in resonator quality factor (Q) and/or increase in resonator insertion loss.

SUMMARY OF THE INVENTION

A periodic signal generator according to embodiments of the present invention is configured to generate high frequency signals characterized by relatively low temperature coefficients of frequency (TCF). According to some of these embodiments of the invention, a microelectromechanical resonator may be geometrically engineered as a dual mode signal generator that produces two periodic signals having unequal resonant frequencies with unequal temperature coefficients. Circuitry is also provided for combining the two periodic signals using a mixer to thereby yield a high frequency low-TCF periodic difference signal at an output of the periodic signal generator.

According to some of these embodiments of the invention, a periodic signal generator includes an oscillator containing a microelectromechanical bulk acoustic resonator therein. This resonator includes a piezoelectric layer and drive and sense electrodes on the piezoelectric layer. The oscillator is configured to generate first and second periodic signals having unequal first and second frequencies ($f_1$, $f_2$). The first and second periodic signals are characterized by respective first and second temperature coefficients of frequency ($TCf_1$, $TCf_2$) that differ by at least about 10 ppm/° C. A frequency multiplier is also provided, which is responsive to the first periodic signal. The frequency multiplier is configured to generate a periodic output signal having a frequency equal to N times a frequency of the first periodic signal, where N is a positive real number. A mixer circuit is also provided. The mixer circuit is configured to generate a periodic beat signal in response to the second periodic signal and the periodic output signal. The periodic beat signal has a frequency $f_b$ equal to $f_2 - Nf_1$ and a temperature coefficient of frequency ($TCf_b$) of less than a smaller of $TCf_1$ and $TCf_2$. In particular, the value of $TCf_b$ is equal to $TCf_1 + \mu_f(TCf_2 - TCf_1)$, where $\mu_f = f_2/f_b$.

According to some embodiments of the invention, the mixer circuit includes a low pass filter, which is configured to pass the periodic beat signal. The microelectromechanical bulk acoustic resonator is preferably configured to support capacitive and piezoelectric transduction. For example, the microelectromechanical bulk acoustic resonator may be a capacitively and piezoelectrically transduced CBAR.

According to still further embodiments of the invention, a periodic signal, generator includes an oscillator containing a microelectromechanical bulk acoustic resonator having a piezoelectric layer therein and drive and sense electrodes on the piezoelectric layer. This oscillator is configured to support capacitive and piezoelectric transduction. In particular, the microelectromechanical bulk acoustic resonator may be a combined capacitively and piezoelectrically transduced concave bulk acoustic resonator (CBAR), which is configured to generate first and second periodic signals having unequal first and second frequencies ($f_1$, $f_2$). These first and second periodic signals may be characterized by respective first and second temperature coefficients of frequency ($TCf_1$, $TCf_2$) that differ by at least about 10 ppm/° C.

DETAILED DESCRIPTION OF EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
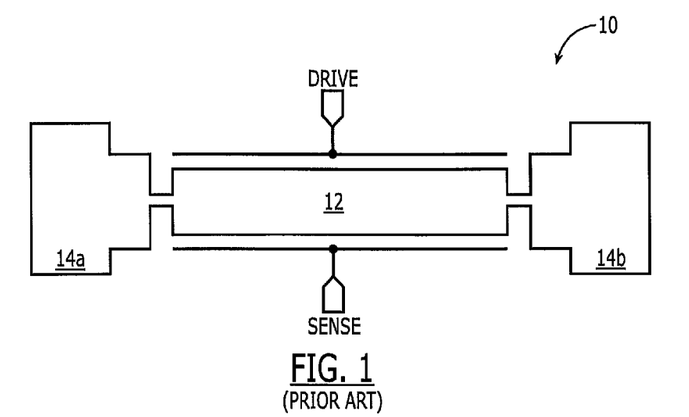
FIG. 1 is a plan view of a silicon bulk acoustic resonator (SiBAR) according to the prior art
Figure 2A:
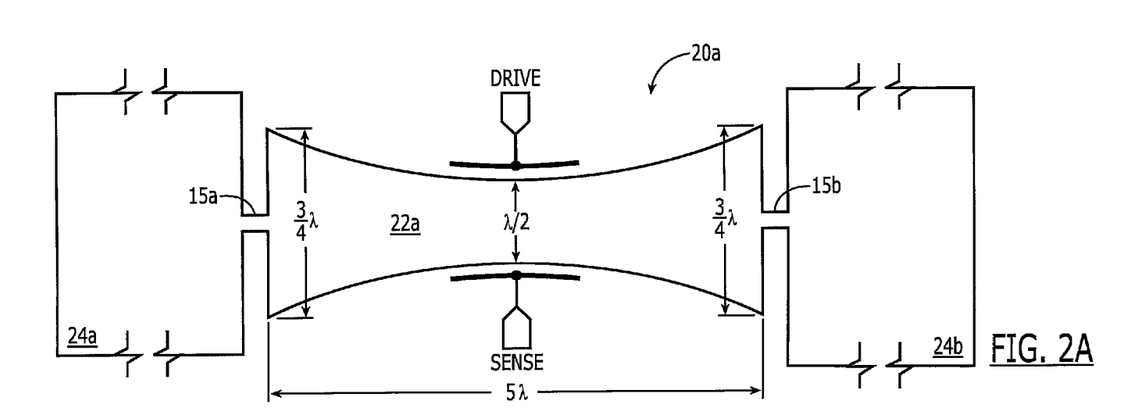
FIG. 2A is a plan view of a concave bulk acoustic resonator (CBAR) according to an embodiment of the invention.

FIG. 2A illustrates a capacitive-type concave bulk acoustic resonator (CBAR) $20a$ having resonator body $22a$ (e.g., silicon) that is suspended opposite a recess (not shown) within a substrate $24a$, $24b$ by a pair of opposing supports/anchors $15a$, $15b$ located at opposite ends of the resonator body $22a$. In contrast to the conventional bulk acoustic resonator 10 of FIG. 1, which includes a rectangular-shaped resonator body 12 suspended opposite a recess (not shown) in a substrate $14a$, $14b$, the CBAR $20a$ includes opposing concave-shaped sides. These sides curve inward relative to each other so that a minimum spacing at a center of the resonator body $22a$ is $\lambda/2$, where $\lambda$ is a wavelength associated with a resonant frequency of the resonator body $22a$.

As further illustrated by FIG. 2A, a drive electrode (DRIVE) extends adjacent the first concave-shaped side of the resonator body $22a$ and a sense electrode (SENSE) extends adjacent a second concave-shaped side of the resonator body $22a$. In contrast to the resonator 10 of FIG. 1, the width of the drive electrode (and sense electrode) as measured along the first concave-shaped side of the resonator body $22a$ is less than a spacing ($5\lambda$) between the first and second ends of the resonator body $22a$. In particular, the width of the drive electrode as measured along the first concave-shaped side is preferably less than one-half a spacing between the first and second ends of the resonator body $22a$ and, more preferably, less than one-third a spacing between the first and second ends of the resonator body $22a$.

Moreover, when the widths of the first and second ends of the resonator body $22a$ are equal to $3\lambda/4$, as illustrated by FIG. 2A, the opposing ends will not support acoustic energy at the resonant frequency determined by the central width λ/2. Accordingly, because of the concave shape of the sides extending adjacent the drive and sense electrodes, the resonator 20a operates to concentrate acoustic energy near the central width λ/2 of the resonator body 22a and thereby supports a high quality (Q) of the resonator 20a by reducing acoustic losses at the relatively narrow supports 15a, 15b.

Figure 2B:
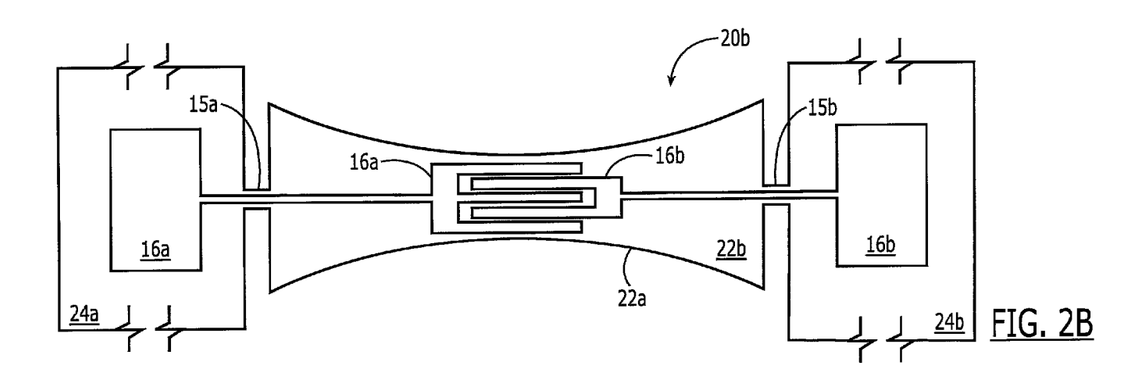
FIG. 2B is a plan view of a concave bulk acoustic resonator (CBAR) according to an embodiment of the invention.
Figure 2C:
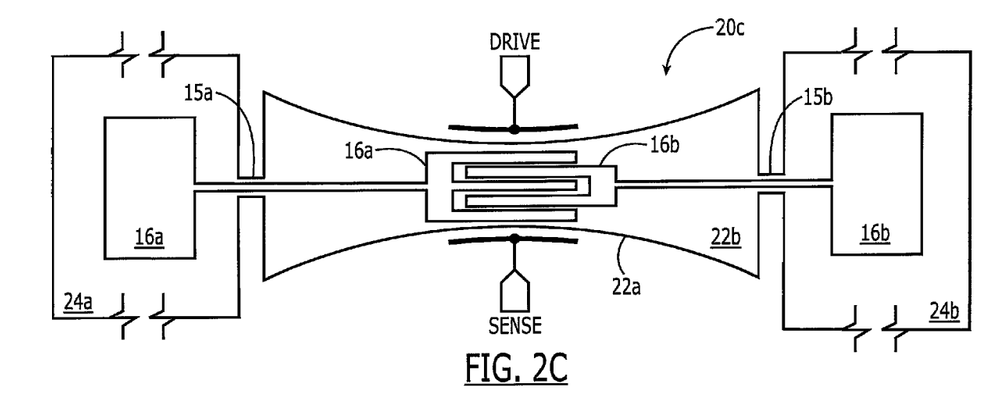
FIG. 2C is a plan view of a capacitively and piezoelectrically transduced concave bulk acoustic resonator (CP-CBAR) according to an embodiment of the invention.

The concave-shaped resonator body 22a of the capacitive-type resonator 20a of FIG. 2A may be utilized within a piezoelectric-type resonator 20b of FIG. 2B. This resonator 20b is illustrated as including a piezoelectric layer 22b (e.g., ZnO) on a resonator body 22a (e.g., silicon) and first and second interdigitated electrodes 16a, 16b on the piezoelectric layer 22b. These electrodes 16a and 16b are patterned to include a plurality of finger-like extensions that operate to concentrate acoustic energy near the center of the resonator body 22a. As illustrated by FIG. 2C, the embodiments of FIGS. 2A and 2B may be combined to yield a concave bulk acoustic resonator (CBAR) 20c that supports both capacitive and piezoelectric transduction using electrostatic drive and sense electrodes and interdigitated electrodes 16a, 16b.

Figure 3:
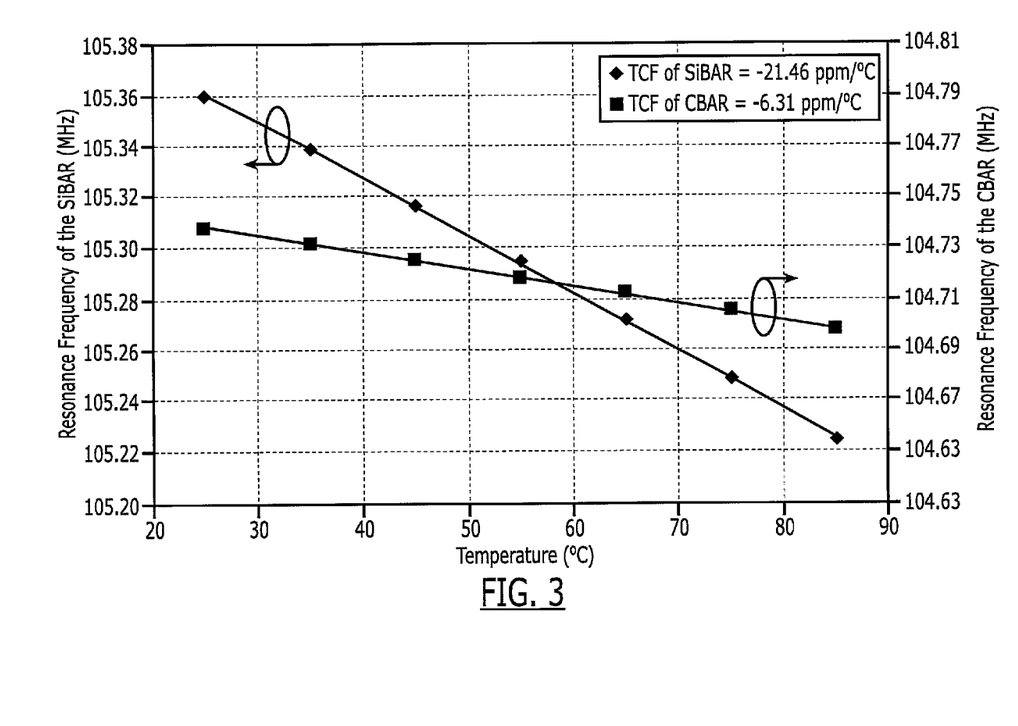
FIG. 3 includes a first graph of resonance frequency of the SiBAR of FIG. 1 versus temperature and a second graph of resonance frequency of the concave SiBAR of FIG. 2A versus temperature.
Figure 4:
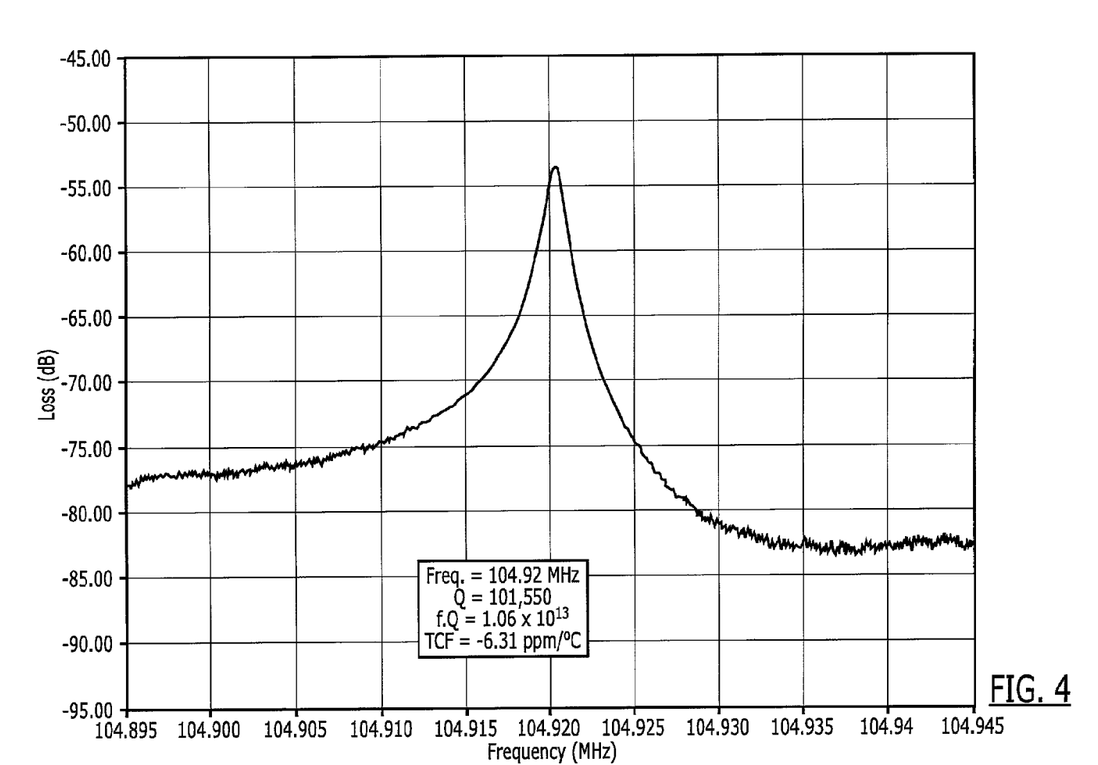
FIG. 4 is a graph that illustrates loss (dB) versus frequency for the CBAR of FIG. 2A (in vacuum).

A comparison of the TCF characteristics of the SiBAR of FIG. 1 versus the TCF characteristics of the CBAR of FIG. 2A is provided by FIG. 3. As illustrated by FIG. 3, a 100 MHz CBAR of FIG. 2A may exhibit a TCF of −6.31 ppm/° C., which is significantly lower than the TCF of −21.46 ppm/° C. of an otherwise equivalent 100 MHz SiBAR having a rectangular-shaped resonator body. These resonators were fabricated on the same boron-doped p-type silicon with a starting resistivity of about 0.001 a-cm. As illustrated by FIG. 4, the measured response of the CBAR in vacuum demonstrates a Q of 101,550 at 104.92 MHz and an fQ product of $1.06 \times 10^{13}$.

One example of the CBAR 20c of FIG. 2C is more fully described in an article by Samarao et al., entitled 'Combined Capacitive and Piezoelectric Transduction for High Performance Silicon Microresonators," MEMS 2011, Cancun, Mexico, Jan. 23-27 (2011), pp. 169-172, the disclosure of which is hereby incorporated herein by reference. As illustrated by the graph of FIG. 5B herein, which is taken from FIG. 9a of the Samarao et al. article, a geometrically engineered CP-CBAR may be operated in: (1) a capacitive-drive and capacitive-sense mode using a 20 Volt polarization voltage (Vp) (e.g., by removing a piezoelectric stack from the concave resonator body); (2) a piezoelectric-drive and piezoelectric-sense mode; (3) a capacitive/piezoelectric-drive and capacitive/piezoelectric-sense mode; and (4) a capacitive-drive and piezoelectric-sense mode. As evident by this graph, the third mode (3) demonstrates highly efficient resonance at multiple frequencies, with reduced acoustic losses caused by spurious signal generation relative to mode (2). In particular, the third mode (3) produces two peak signals between 98 and 102 MHz, which have temperature coefficients of frequency that differ by 10 ppm/° C.

The experimental configurations of these modes are more fully illustrated by FIGS. 3c and 6 of the Samarao et al. article and in a dissertation by Ashwin K. Samarao, entitled "Compensation and Trimming for Silicon Micromechanical Resonators and Resonator Arrays for Timing and Spectral Processing," Dissertation Presented to the Academic Faculty, Georgia Institute of Technology, May 2011, published in depository archives on Jul. 6, 2011, pp. 1-132, the disclosures of which are hereby incorporated herein by reference.

Figure 5A:
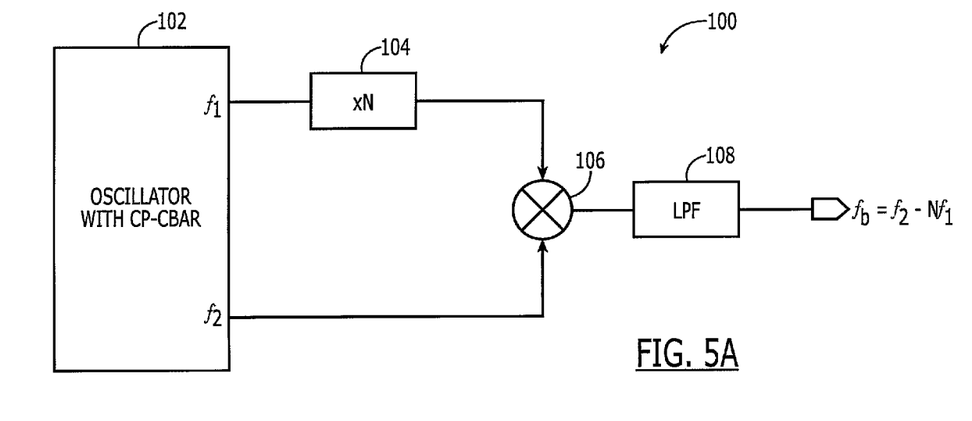
FIG. 5A is a block diagram of a periodic signal generator according to an embodiment of the present invention.
Figure 5B:
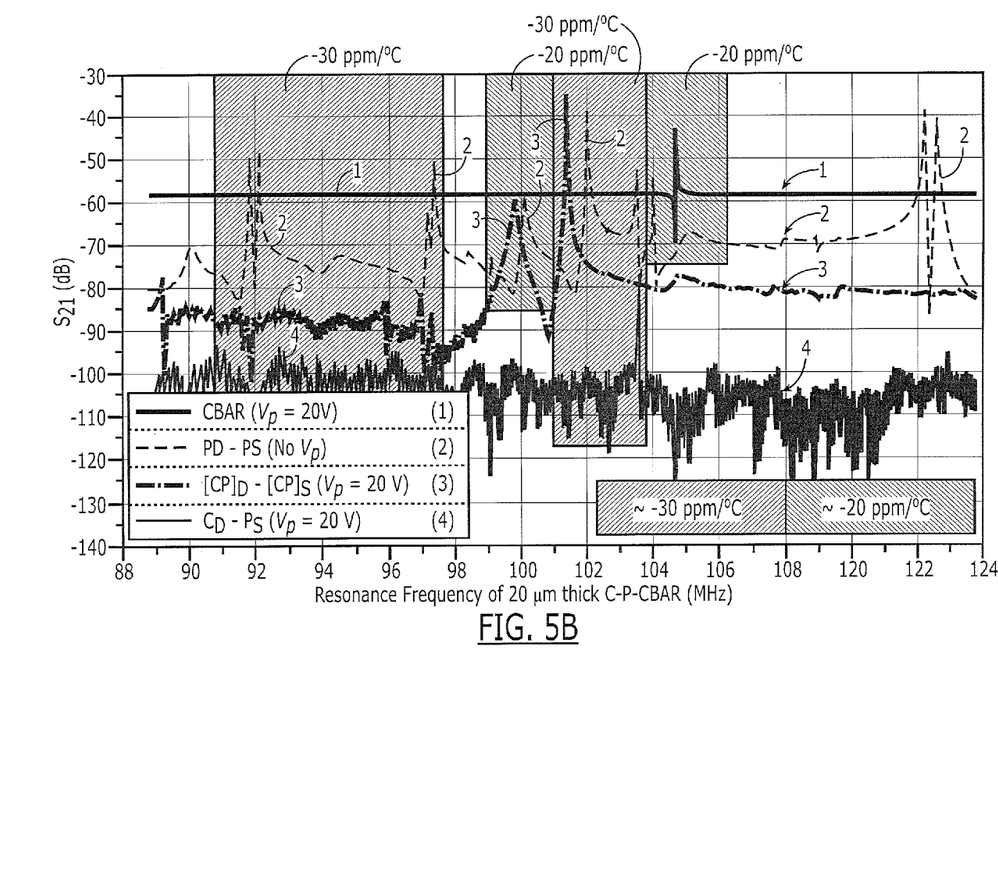
FIG. 5B is a graph illustrating resonant frequencies of a 20 um thick capacitively and piezoelectrically transduced concave bulk acoustic resonator (CBAR) when configured for: (1) capacitive drive and capacitive sense with a 20 Volt polarization voltage (without piezoelectric stack); (2) piezoelectric drive and piezoelectric sense without polarization voltage; (3) capacitive/piezoelectric drive and capacitive/piezoelectric sense with a 20 Volt polarization voltage; and (4) capacitive drive and piezoelectric sense with a 20 Volt polarization voltage.

As highlighted by FIG. 5A, a geometrically engineered resonator may be configured to yield multiple spaced-apart resonant frequency signals having substantially different temperature coefficients of frequency (e.g., −20 ppm/° C. and −30 ppm/° C.) when operating in at least one of the aforementioned modes. These aspects of the CP-CBAR of FIG. 2C (and FIG. 3c of the Samarao et al. article) may be utilized within a periodic signal generator 100 containing an oscillator 102, which is configured to produce first and second periodic signals ($f_1$ and $f_2$) having unequal frequencies with unequal TCFs. The first periodic signal $f_1$ is provided to a multiplier circuit 104, which passes its output to a mixer circuit. This mixer circuit contains a mixer 106, which receives the output of the multiplier circuit 104 and the second periodic signal $f_2$, and a low pass filter 108. The multiplier circuit 104 and mixer circuit collectively form one embodiment of a signal processor that is responsive to the first and second periodic signals.

As will be understood by those skilled in the art, a difference signal generated at an output of the mixer 106 may be passed through a low pass filter 108 to thereby yield a beat signal $f_b$ having a frequency equal to $f_2 - Nf_1$ and a temperature coefficient of frequency $TCf_b$ equal to $TCf_1 + \mu_f(TCf_2 - TCf_1)$, where $\mu_f = f_2/f_b$.

Figure 5C:
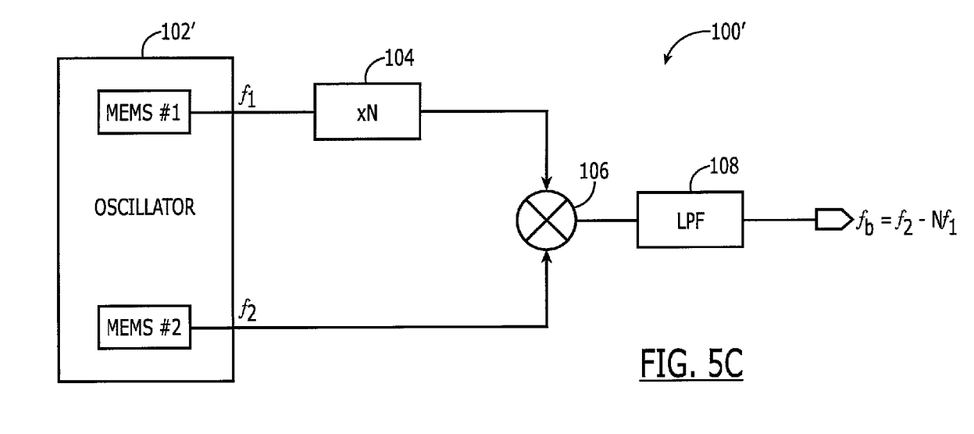
FIG. 5C is a block diagram of a periodic signal generator according to an additional embodiment of the present invention.

Alternatively, as illustrated by FIG. 5C, a periodic signal generator 100' may be provided, which contains an oscillator 102' having multiple MEMs resonators therein. These resonators are configured to produce respective first and second periodic signals ($f_1$ and $f_2$) having unequal frequencies with unequal TCFs. The first periodic signal $f_1$ is provided to a multiplier circuit 104, which passes its output to a mixer circuit. This mixer circuit contains a mixer 106, which receives the output of the multiplier circuit 104 and the second periodic signal $f_2$, and a low pass filter 108. As will be understood by those skilled in the art, a difference signal generated at an output of the mixer 106 may be passed through a low pass filter 108 to thereby yield a beat signal $f_b$ having a frequency equal to $f_2 - Nf_1$ and a temperature coefficient of frequency $TCf_b$ equal to $TCf_1 + \mu_f(TCf_2 - TCf_1)$, where $\mu_f = f_2/f_b$.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A periodic signal generator, comprising:
    an oscillator comprising a microelectromechanical bulk acoustic resonator having a piezoelectric layer therein and drive and sense electrodes on the piezoelectric layer, said oscillator configured to generate first and second periodic signals having unequal first and second frequencies ($f_1$, $f_2$), said first and second periodic signals characterized by respective first and second temperature coefficients of frequency ($TCf_1$, $TCf_2$) that differ by at least about 10 ppm/° C.;
    a frequency multiplier responsive to the first periodic signal, said frequency multiplier configured to generate a periodic output signal having a frequency equal to N times a frequency of the first periodic signal, where N is a real number greater than one; and
    a mixer circuit configured to generate a periodic beat signal in response to the second periodic signal and the periodic output signal, said periodic beat signal having a frequency $f_b$ equal to $f_2 - Nf_1$ and a temperature coefficient of frequency ($TCf_b$) of less than a smaller of the absolute value of $TCf_1$ and $TCf_2$.

2. The generator of claim 1, wherein said mixer circuit comprises a low pass filter configured to pass the periodic beat signal.

3. The generator of claim 1, wherein:

$$TCf_b = TCf_1 + \mu_f(TCf_2 - TCf_1), \text{ where } \mu_f = f_2/f_b.$$

4. The generator of claim 3, wherein said microelectromechanical bulk acoustic resonator is configured to support capacitive and piezoelectric transduction.

5. The generator of claim 3, wherein said microelectromechanical bulk acoustic resonator is a combined capacitively and piezoelectrically transduced CBAR.

6. The generator of claim 1, wherein said microelectromechanical bulk acoustic resonator is configured to support capacitive and piezoelectric transduction.

7. The generator of claim 1, wherein said microelectromechanical bulk acoustic resonator is a combined capacitively and piezoelectrically transduced CBAR.

8. A periodic signal generator, comprising:
an oscillator comprising at least one microelectromechanical bulk acoustic resonator having a piezoelectric layer therein and drive and sense electrodes on the piezoelectric layer, said oscillator configured to generate first and second periodic signals having unequal first and second frequencies ($f_1$, $f_2$), said first and second periodic signals characterized by respective first and second temperature coefficients of frequency ($TCf_1$, $TCf_2$) that differ by at least about 5 ppm/° C.;
a frequency multiplier responsive to the first periodic signal, said frequency multiplier configured to generate a periodic output signal having a frequency equal to N times a frequency of the first periodic signal, where N is a positive real number; and
a mixer circuit configured to generate a periodic beat signal in response to the second periodic signal and the periodic output signal, said periodic beat signal having a frequency $f_b$ equal to $f_2 - Nf_1$ and a temperature coefficient of frequency ($TCf_b$) of less than a smaller of the absolute value of $TCf_1$ and $TCf_2$.

9. The generator of claim 8, wherein said mixer circuit comprises a low pass filter configured to pass the periodic beat signal.

10. The generator of claim 8, wherein:

$$TCf_b = TCf_1 + \mu_f(TCf_2 - TCf_1), \text{ where } \mu_f = f_2/f_b.$$

11. The generator of claim 10, wherein said microelectromechanical bulk acoustic resonator is configured to support capacitive and piezoelectric transduction.

12. The generator of claim 10, wherein said microelectromechanical bulk acoustic resonator is a combined capacitively and piezoelectrically transduced CBAR.

13. The generator of claim 8, wherein said microelectromechanical bulk acoustic resonator is configured to support capacitive and piezoelectric transduction.

14. The generator of claim 8, wherein said microelectromechanical bulk acoustic resonator is a combined capacitively and piezoelectrically transduced CBAR.

* * * * *